(12) United States Patent
Takano

(10) Patent No.: US 8,058,717 B2
(45) Date of Patent: Nov. 15, 2011

(54) LAMINATED BODY OF SEMICONDUCTOR CHIPS INCLUDING PADS MUTUALLY CONNECTED TO CONDUCTIVE MEMBER

(75) Inventor: Akihito Takano, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/768,938

(22) Filed: Apr. 28, 2010

(65) Prior Publication Data

US 2010/0320584 A1 Dec. 23, 2010

(30) Foreign Application Priority Data

Jun. 18, 2009 (JP) .................................. 2009-145430

(51) Int. Cl.
*H01L 23/50* (2006.01)
(52) U.S. Cl. ................................ 257/686; 257/E23.079
(58) Field of Classification Search .................. 257/686, 257/777, E23.079
See application file for complete search history.

(56) References Cited

U.S. PATENT DOCUMENTS

| | | | |
|---|---|---|---|
| 5,675,180 A | 10/1997 | Pedersen et al. | |
| 6,522,022 B2 * | 2/2003 | Murayama | 257/786 |
| 6,628,527 B2 * | 9/2003 | Muramatsu et al. | 361/768 |
| 7,589,410 B2 * | 9/2009 | Kim | 257/686 |
| 7,759,785 B2 * | 7/2010 | Corisis et al. | 257/690 |
| 7,768,795 B2 * | 8/2010 | Sakurai et al. | 361/790 |
| 7,772,689 B2 * | 8/2010 | Kobayashi et al. | 257/701 |
| 7,777,349 B2 * | 8/2010 | Murayama et al. | 257/777 |
| 7,843,059 B2 * | 11/2010 | Gomyo et al. | 257/723 |
| 2005/0230802 A1 * | 10/2005 | Vindasius et al. | 257/686 |
| 2007/0284716 A1 * | 12/2007 | Vindasius et al. | 257/686 |
| 2008/0111225 A1 * | 5/2008 | Kim et al. | 257/686 |
| 2008/0224298 A1 * | 9/2008 | Corisis et al. | 257/690 |
| 2009/0020887 A1 * | 1/2009 | Mizuno et al. | 257/777 |
| 2009/0020889 A1 * | 1/2009 | Murayama et al. | 257/777 |
| 2009/0023247 A1 * | 1/2009 | Mizuno et al. | 438/109 |
| 2009/0146283 A1 * | 6/2009 | Chen et al. | 257/686 |
| 2009/0146284 A1 * | 6/2009 | Kim et al. | 257/686 |
| 2009/0179318 A1 * | 7/2009 | Chen | 257/686 |
| 2009/0206464 A1 * | 8/2009 | Chung et al. | 257/686 |
| 2009/0230533 A1 * | 9/2009 | Hoshino et al. | 257/686 |
| 2010/0320585 A1 * | 12/2010 | Jiang et al. | 257/686 |

FOREIGN PATENT DOCUMENTS

| | | |
|---|---|---|
| JP | 2000-340694 A | 12/2000 |
| JP | 3895768 B2 | 3/2007 |

\* cited by examiner

*Primary Examiner* — Nathan Ha
(74) *Attorney, Agent, or Firm* — IPUSA, PLLC

(57) ABSTRACT

A semiconductor chip laminated body includes a wiring board having a connecting terminal; a plurality of semiconductor chips laminated on the wiring board, each of the semiconductor chips having a pad; conductive connecting members having first end parts connected to the pads of the corresponding semiconductor chips and second end parts projecting from side surfaces of the corresponding semiconductor chips; and a conductive member configured to connect the connecting terminal of the wiring board and the second end parts of the conductive connecting members; wherein conductive materials are exposed at the side surfaces of the semiconductor chips; and a gap is provided between the side surfaces of the semiconductor chips and the conductive member.

7 Claims, 13 Drawing Sheets

US 8,058,717 B2

LAMINATED BODY OF SEMICONDUCTOR CHIPS INCLUDING PADS MUTUALLY CONNECTED TO CONDUCTIVE MEMBER

CROSS-REFERENCE TO RELATED APPLICATIONS

This patent application is based upon and claims the benefit of priority of Japanese Patent Application No. 2009-145430 filed on Jun. 18, 2009 the entire contents of which are incorporated herein by reference.

BACKGROUND OF THE INVENTION

1. Field of the Invention

The present invention generally relates to semiconductor chip laminated bodies. More specifically, the present invention relates to a semiconductor chip laminated body where semiconductor chips are laminated.

2. Description of the Related Art

Research and development of a high density mounting technology of semiconductor devices has been progressing in order to correspond to needs such as making a portable information device or a small sized electronic device having a high function and a small size. In this technology, a function of a wafer level package (WLP) technique has been important. In the WLP technique, a package is manufactured in a state where a size of a semiconductor wafer is maintained. The semiconductor wafer is cut into pieces of semiconductor chip size packages (CSPs). A single CSP or combined CSPs, as a new package, is or are installed in an application device. Due to development of recent contents technology and requirements of large capacity of a memory, a laminating technology, of a chip, which is a part of the CSP, has been widely used. By the laminating technology of the chip, plural semiconductor chips having reliabilities are laminated so that a new package is formed.

Japanese Laid-Open Patent Application Publication No. 2000-340594 with respect to chip laminating discusses an example of laminating of semiconductor chips. However, in the technology discussed in Japanese Laid-Open Patent Application Publication No. 2000-340694, a complex manufacturing process is required for making outside connection on a side surface of the semiconductor chip after the wafer is diced. For example, a complex manufacturing process is required where an anisotropic conductive film or a flexible circuit board is used or an insulation film and a conductive film are laminated after multiple semiconductor chips are laminated. In addition, in another example of laminating of the semiconductor chips discussed in Japanese Patent No. 3895768 and shown in FIG. 1, for example, after the semiconductor chip is diced, a complex process where nitride is sputtered in order to insulate side surfaces 12 of semiconductor chips 11 is required. Thus, a manufacturing process of chip laminating is complex and thereby product quality is influenced.

SUMMARY OF THE INVENTION

Accordingly, embodiments of the present invention may provide a novel and useful semiconductor chip laminated body solving one or more of the problems discussed above.

More specifically, the embodiments of the present invention may provide a semiconductor chip laminated body of which a manufacturing process can be simplified and of which quality can be improved.

Another aspect of the embodiments of the present invention may be to provide a semiconductor chip laminated body, including a wiring board having a connecting terminal; a plurality of semiconductor chips laminated on the wiring board, each of the semiconductor chips having a pad; conductive connecting members having first end parts connected to the pads of the corresponding semiconductor chips and second end parts projecting from side surfaces of the corresponding semiconductor chips, and a conductive member configured to connect the connecting terminal of the wiring board and the second end parts of the conductive connecting members; wherein conductive materials are exposed at the side surfaces of the semiconductor chips; and a gap is provided between the side surfaces of the semiconductor chips and the conductive member.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below, with reference to the FIG. 2 through FIG. 13 of embodiments of the present invention.

First Embodiment

Figure 1:
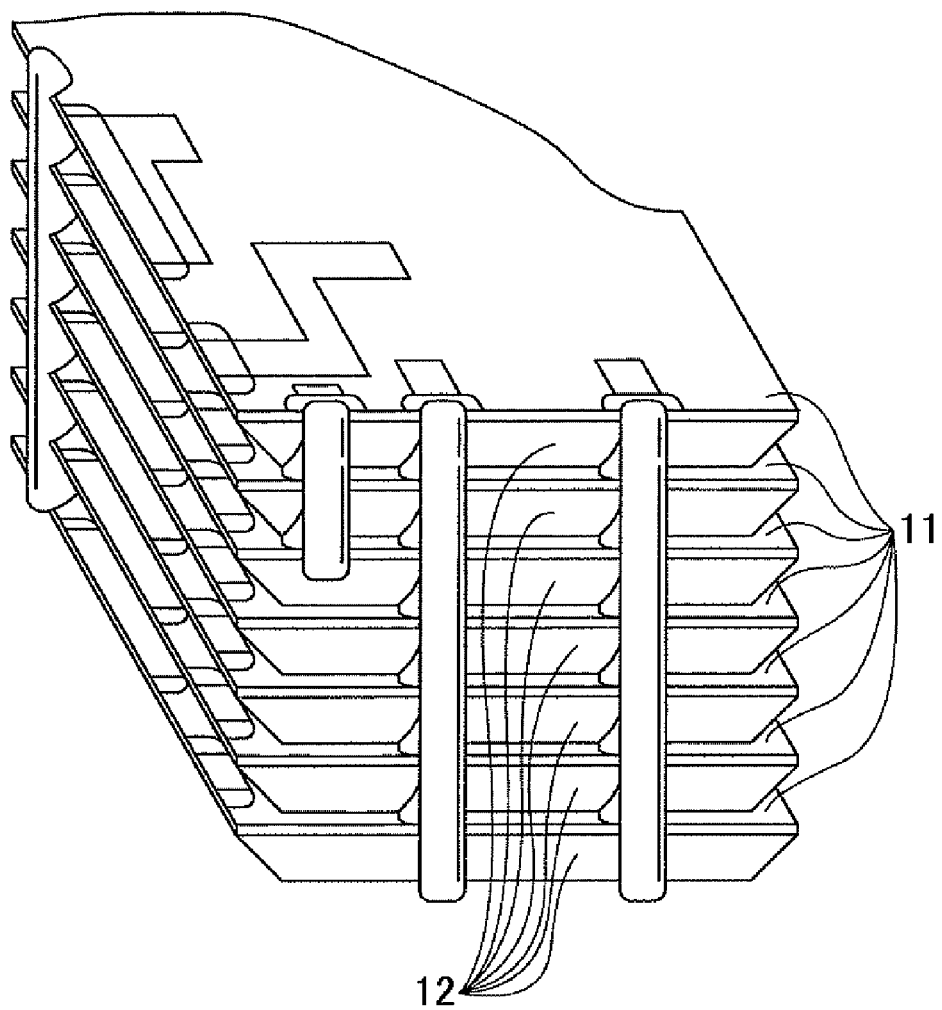
FIG. 1 is a perspective view showing an example of a related art semiconductor chip laminated structure.
Figure 2:
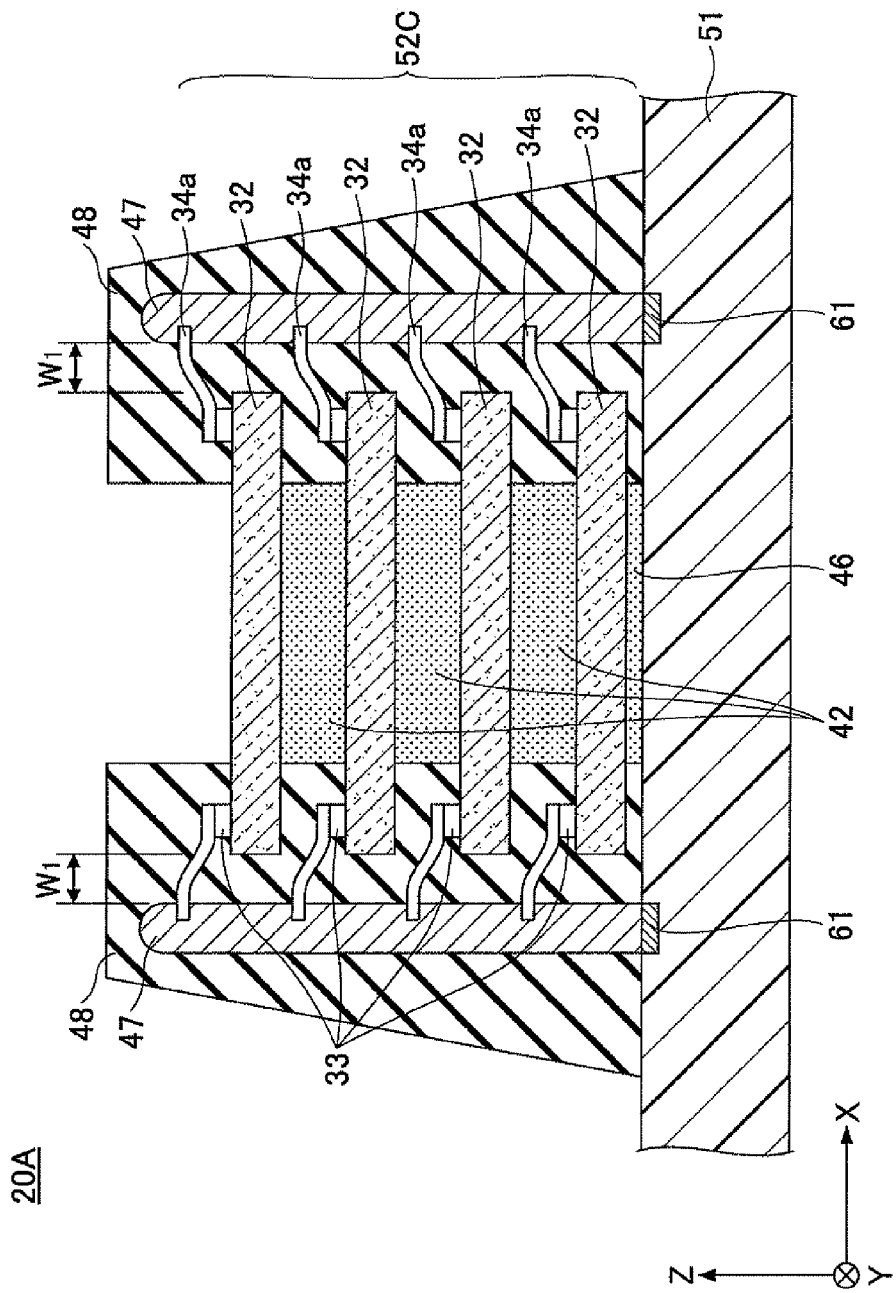
FIG. 2 is a cross-sectional view showing an example of a semiconductor chip laminated body of a first embodiment of the present invention.

FIG. 2 is a cross-sectional view showing an example of a semiconductor chip laminated body of a first embodiment of the present invention.

As shown in FIG. 2, a semiconductor chip laminated body 20A includes a wiring board 51 and a chip laminated body 52C. The chip laminated body 52C is mounted on the wiring board 51. The chip laminated body 52C includes plural semiconductor chips 32, bonding wires 34a, conductive members 47, and sealing resin 48. Each of the semiconductor chips 32 includes pads 33. One of the bonding wires 34a is connected to each of the pads 33.

In the chip laminated body 52C, the plural semiconductor chips 32 are laminated via insulation resin 42. The plural laminated semiconductor chips 32 are mounted on the wiring board 51 via insulation resin 46. In addition, in the chip laminated body 52C, end parts of the bonding wires 34a projecting from side surfaces of the plural semiconductor chips 32 are conductively connected to connection terminals 61 of the wiring board 51 by the conductive members 47. An entirety or parts of the end parts of the bonding wires 34a are sealed by the sealing resin 48.

The semiconductor chip 32 is made of, for example, silicon. The side surfaces of the semiconductor chip 32 are neither protected nor insulated by an insulation film made of, for example, silicon dioxide. Hence, a conductive material such as silicon is exposed at the side surfaces of the semiconductor chip 32. On the other hand, the conductive member 47 is made of a conductive material, for example, conductive paste such as silver paste or solder. Thus, both the side surfaces of each of the neighboring semiconductor chips 32 and the conductive members 47 have conductivities. Accordingly, it is necessary to prevent contact of the conductive members 47 and the side surfaces of each of the semiconductor chips 32. Because of this, gaps $W_1$ are provided between the conductive members 47 and the corresponding side surfaces of each of the semiconductor chips 32. It is preferable to set the gap $W_1$ equal to or greater than approximately 50 μm in order to prevent the contact of the conductive members 47 and the side surfaces of the semiconductor chips 32.

Thus, in the embodiment of the present invention, in the chip laminated body 52C, a designated gap $W_1$ is provided between the conductive member 47 and the side surface of each of the semiconductor chips 32. As a result of this, a step of forming an insulation film on the side surfaces of each of the semiconductor chips 32 is not required in a manufacturing method of a semiconductor chip laminated body discussed below. Therefore, it is possible to simplify a forming step of the semiconductor chip laminated body so that productivity can be improved.

Figure 3:
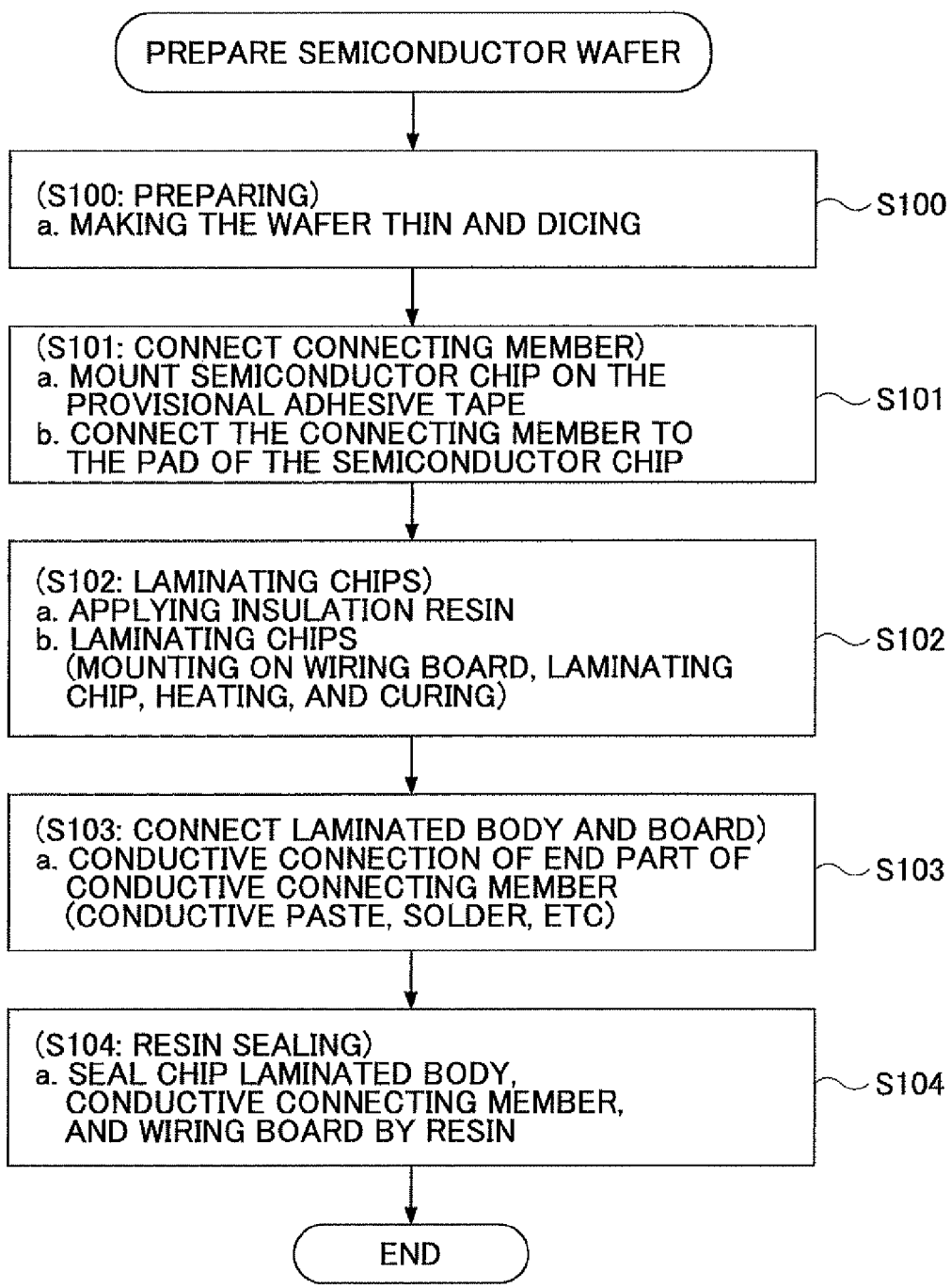
FIG. 3 is a flowchart showing steps of a manufacturing method of the semiconductor chip laminated body of the first embodiment of the present invention.

FIG. 3 is a flowchart showing steps of a manufacturing method of the semiconductor chip laminated body of the first embodiment of the present invention. This manufacturing method includes steps of "S100: Preparing", "S101: Connect connecting member", "S102: Laminating chips", "S103: Connect laminated body and board", and "S104: Resin sealing". Each of the steps is discussed with reference to a corresponding drawing.

(S100: Preparing)

A prepared semiconductor wafer, having a diameter of, for example, 6 inches, 8 inches, or 12 inches is made thin by back grinding or the like. In addition, dicing is applied so that the semiconductor wafer is divided into pieces of semiconductor chips. The diced semiconductor chips are provided on a dicing tape.

(S101: Connect Connecting Member)

In a step "a" of S101, each of the semiconductor chips prepared in S101 is picked up from the dicing tape so as to be mounted on a provisional adhesive film. As a material of the provisional adhesive film, for example, a polyester film can be used.

In a step "b" of S101, a conductive connecting member is connected to a pad of the semiconductor chip. A bonding wire, for example, is used as the conductive connecting member. In the following description, an example where the bonding wire is used as the conductive connecting member is discussed.

Figure 4:
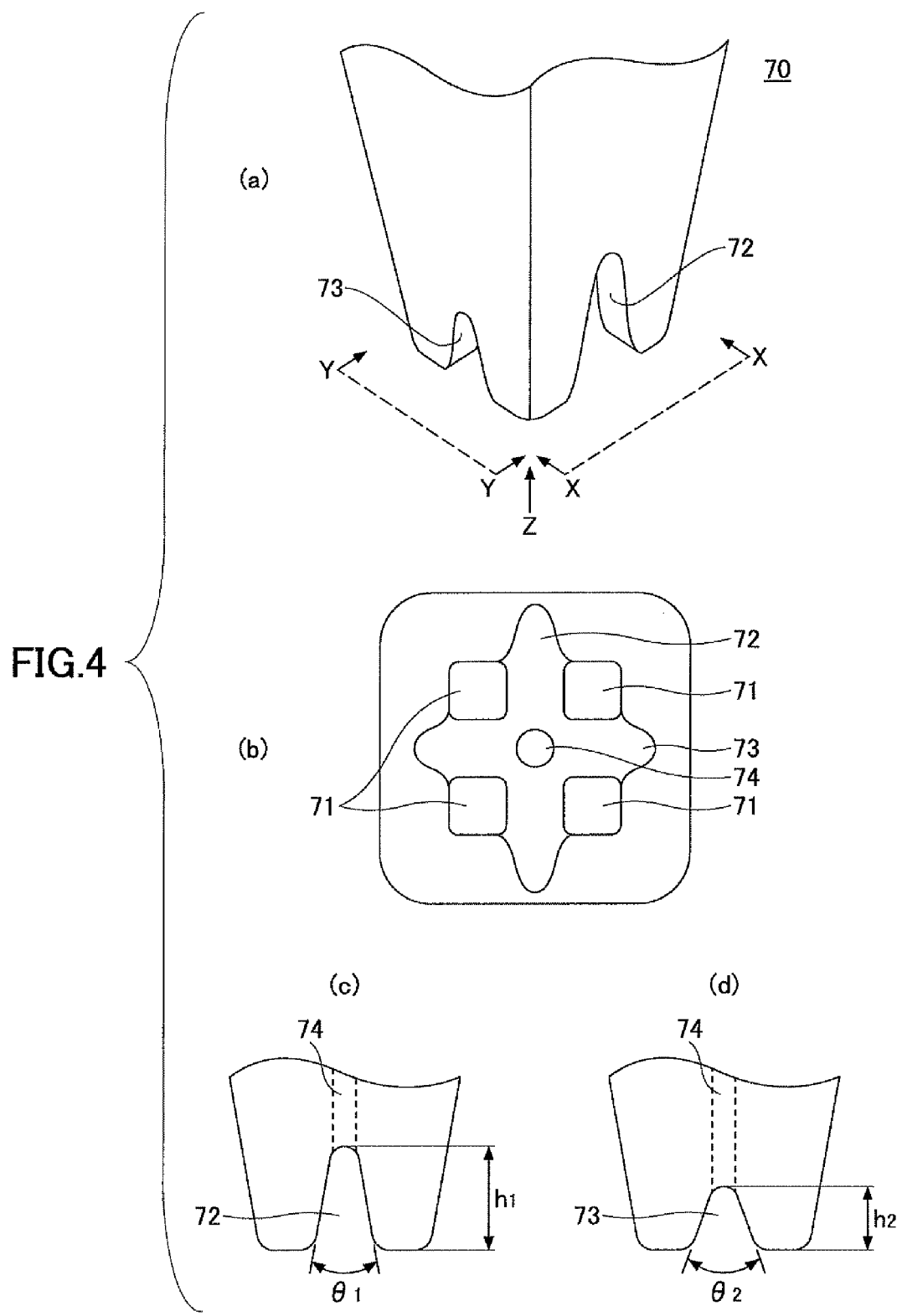
FIG. 4 is a view showing an example of a bonding tool of the first embodiment of the present invention.

In the meantime, FIG. 4 is a view showing an example of a head end part of a bonding tool 70 of a wire bonder device used in S101. More specifically, FIG. 4(a) is a perspective view of the bonding tool 70. FIG. 4(b) is a bottom view seen in a Z direction. FIG. 4(c) is a side view seen in an X direction. FIG. 4(d) is a side view seen in a Y direction. A hole part 74 situated in the center (see FIG. 4(b)) is a piercing hole through which the bonding wire passes. The bonding tool 70 has a function as a capillary. Furthermore, the bonding tool 70 includes a bottom surface part 71 and grooves 72 and 73. Depths h1 and h2 and opening angles θ1 and θ2 of opening parts of the grooves 72 and 73 are different from each other. The grooves 72 and 73 can be properly used in different ways depending on uses.

Figure 5:
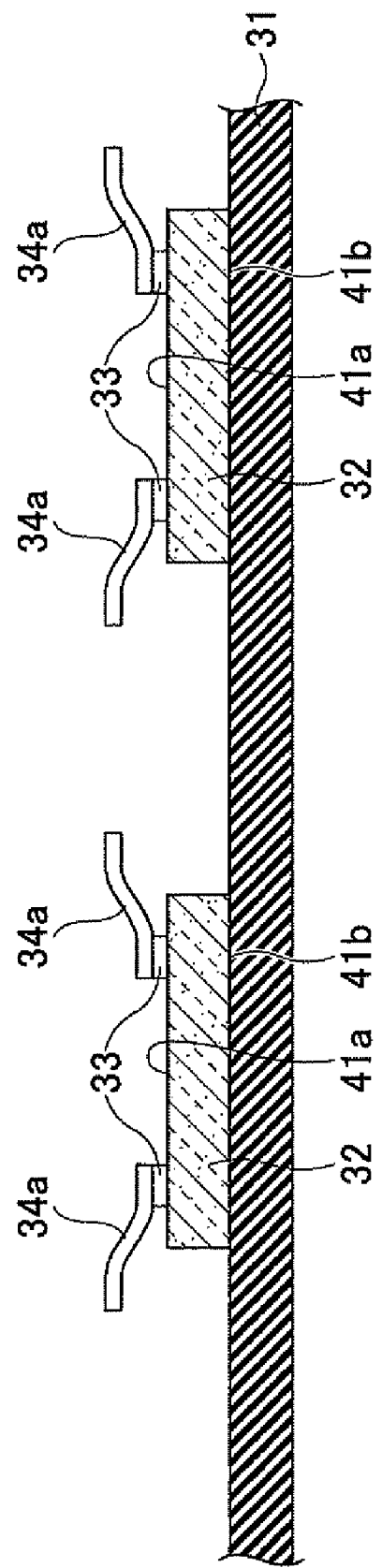
FIG. 5 is a first view showing an example of a manufacturing method of the semiconductor chip laminated body of the first embodiment of the present invention.

In the meantime, in FIG. 5 the bonding wires 34a are connected to the pads 33 of the semiconductor chips 32 mounted on a provisional adhesive film 31. In FIG. 5, there are an integrated circuit surface 41a of the semiconductor chip 32 and a rear surface 41b of the semiconductor chip 32.

The length of each of the bonding wires 34a is set by considering, in advance, a deformation amount of the bonding wire which is deformed when thermo-compression bonding is applied on the wiring board 51. As a material of the bonding wire 34a, gold, copper, aluminum, tungsten, or an alloy thereof can be used. Normally, a diameter of the bonding wire 34a is approximately 15 μm through approximately 30 μm. The thickness of the semiconductor chip 32 is, for example, approximately 40 μm through approximately 50 μm and may be variable depending on functions of the semiconductor chip 32, use of the product, or the like. A notch such as an inclination surface may be provided at a corner part of each of the semiconductor chips 32 so that a space in the vicinity of an edge part can be made wide, and thereby contact of the bonding wires 34a and the edge parts or the like of the semiconductor chips 32 can be prevented. The notch such as the inclination surface may be formed by, for example, applying bevel cutting using a dicer device when the semiconductor wafer is cut into pieces of the semiconductor chips 32.

Figure 6:
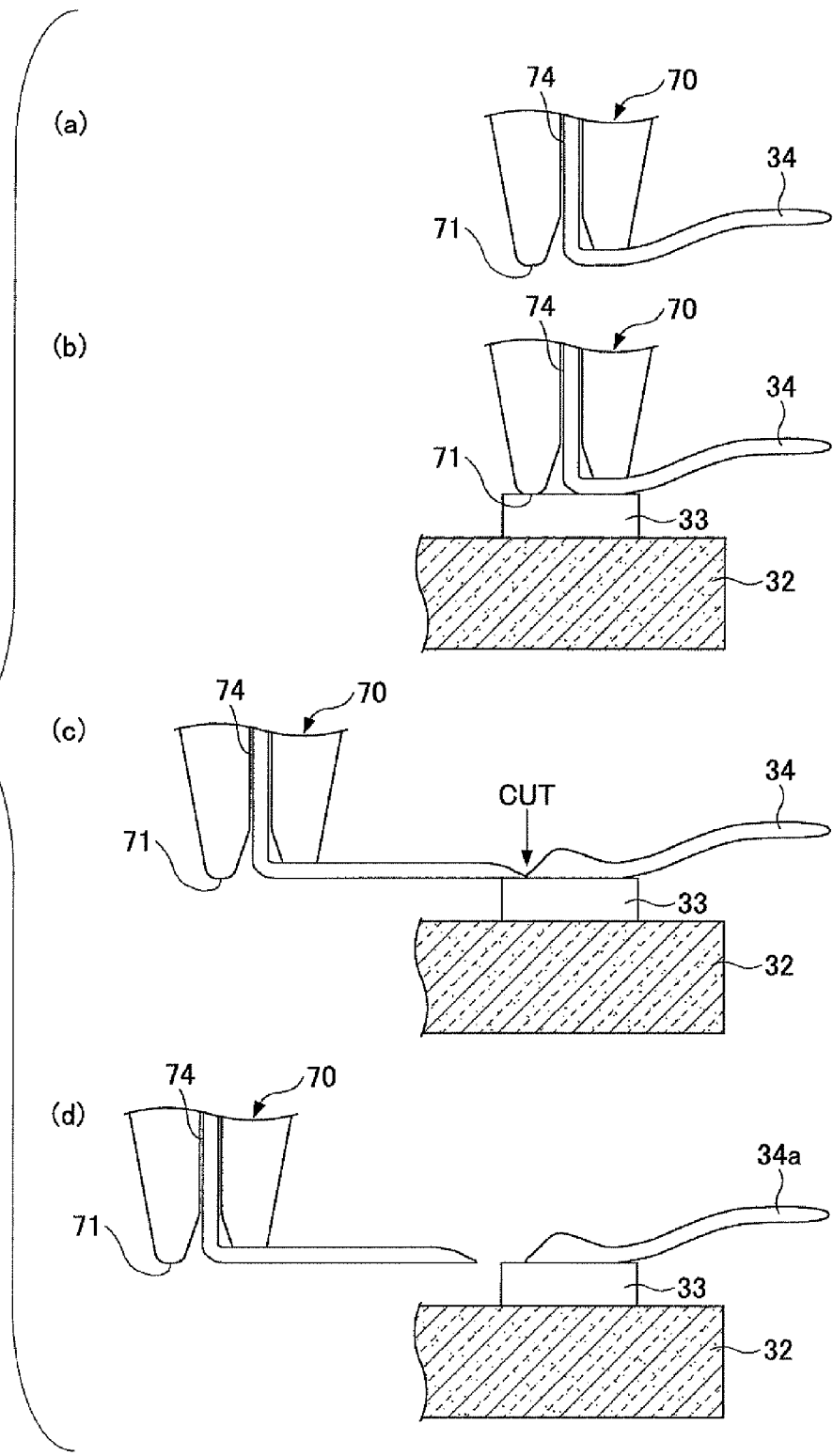
FIG. 6 is a second view showing an example of a manufacturing method of the semiconductor chip laminated body of the first embodiment of the present invention.

FIG. 6 is a view showing an example of a method where the bonding wire 34a is connected to the pad 33 of the semiconductor chip 32 shown in FIG. 5 by using the bonding tool 70 shown in FIG. 4. First, as shown in FIG. 6(a), a designated length of a bonding wire 34 is sent out, in advance, from the hole part 74 of the bonding tool 70 so that a designated configuration of the bonding wire 34 is formed. The bonding wire 34 is eventually cut so as to be the bonding wire 34a.

Next, as shown in FIG. 6(b), the bottom surface part 71 of the bonding tool 70 comes in contact with the pad 33 of the semiconductor chip 32 and ultrasonic vibration, heating, and pressing are applied to the bonding wire 34. As a result of this, the bonding wire 34 is connected to the pad 33.

Next, as shown in FIG. 6(c), while a designated length of the bonding wire 34 is sent out, the bonding tool 70 is moved. At this time, since a part of the bonding wire 34 indicated by an arrow in FIG. 6(c) is thin, it is possible, as shown in FIG. 6(d), to cut the bonding wire 34 at the part indicated by the arrow in FIG. 6(c). Thus, the bonding wire 34a can be connected to the pad 33 of the semiconductor chip 32 shown in FIG. 5.

Figure 7:
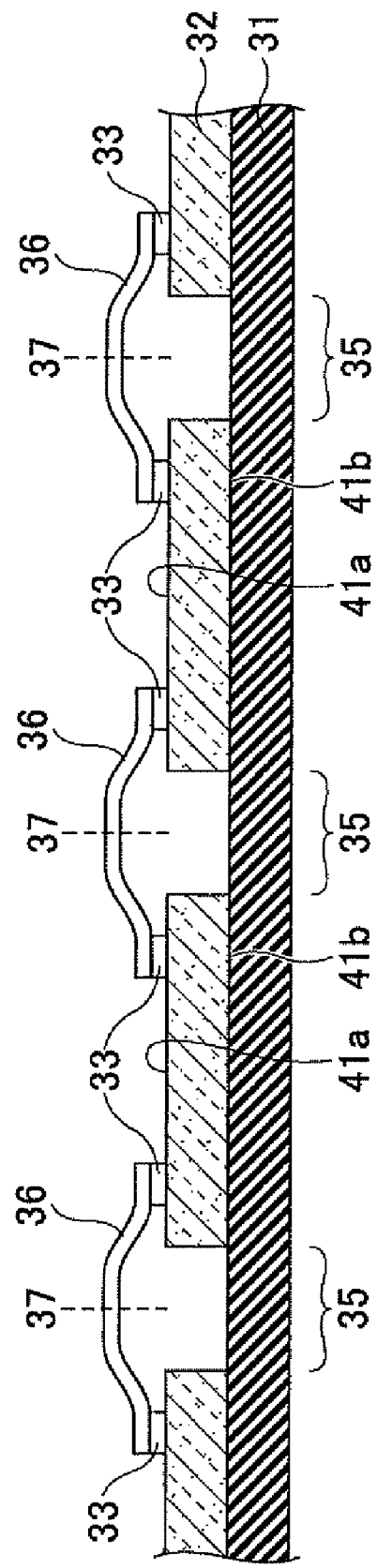
FIG. 7 is a third view showing an example of a manufacturing method of the semiconductor chip laminated body of the first embodiment of the present invention.

As shown in FIG. 7, the pads 33 are connected to each other by conductive connecting members 36 which have configurations straddling gaps 35 separating the semiconductor chips 32. The bonding wires 34a may be connected to the pads 33 of the semiconductor chips 32 shown in FIG. 5 by cutting the conductive connecting members 36 at cutting parts 37 (that is, the conductive connecting members 36 which are cut may become the bonding wires 34a).

(S102: Laminating Chips, a. Applying Insulation Resin)

Each of the semiconductor chips 32 is removed from the provisional adhesive film 31 shown in FIG. 5 and FIG. 6. The insulation resin 42 is applied to the rear surface 41b of the semiconductor chip 32 having the bonding wires 34a. The insulation resin 42 can be applied by a screen printing method, a spin coating method, adhering a film sheet, or the like.

Epoxy resin or the like can be used as a material of the insulation resin 42. A material having a thermoplastic function can be used as the material of the insulation resin 42. For preparing the next step ("b" of S102: Laminating chip), the insulation resin is provisionally cured. The temperature of the provisional curing is, for example, approximately 125° C. in the case of the screen printing, approximately 125° C. in the case of the screen coating, or approximately 80° C. in the case of use of the film sheet.

(S102: Laminating Chips, b. Laminating Chips)

Figure 8:
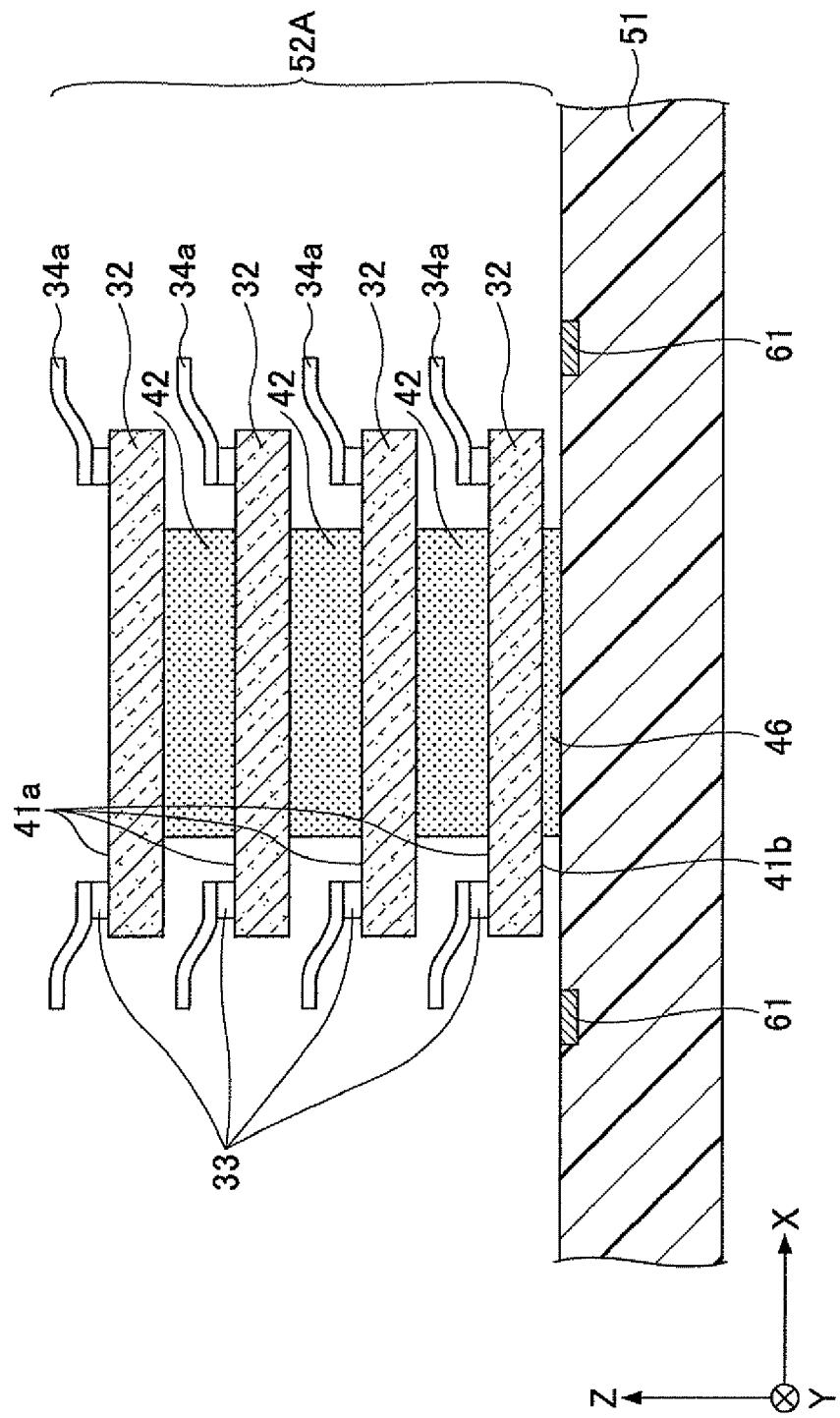
FIG. 8 is a fourth view showing an example of a manufacturing method of the semiconductor chip laminated body of the first embodiment of the present invention.

FIG. 8 shows the semiconductor chips 32 having the bonding wires 34a and the insulation resin 42 mounted on the wiring board 51 so that, as a whole, a chip laminated body 52A is formed. Chip laminating is performed by picking up each of the semiconductor chips 32. In order to form the chip laminating body 52A, a die mounting device or a flip chip mounter device is used so that alignment and fixing of the semiconductor chips 32 are performed. Mounting the chip laminated body 52A on the wiring board 51 and fixing by the insulation resin are performed under the condition of heating at approximately 150° C. for approximately 30 minutes.

It is not necessary to provide the insulation resin on the integrated circuit surface 41a of the semiconductor chip 32 situated at the top. On the other hand, insulation resin 46 is provided on the rear surface 41b of the semiconductor chip 32 at the bottom so that the chip laminating body 52A is adhered to and mounted on the wiring board 51. Die-bonding paste can be used as a material of the insulation resin 46. As a material of the die-bonding paste, for example, an epoxy group paste where alumina is included as filler can be used.

The semiconductor chips 32 face upward. Therefore, a connecting member (bonding wire) is not provided at a portion of the insulation resin 46 provided at a surface facing the wiring board 51 of the semiconductor chip 32 at the bottom. Therefore, a function as a spacer of the insulation resin 46 is not required so that the insulation resin 46 can be made thin. Compared to a case where the semiconductor chips 32 face downward, in the case where the semiconductor chips 32 face upward, it is possible to reduce the entire thickness of the chip laminating body 52A. The side surfaces of the semiconductor chips 32 are neither protected nor insulated by an insulation film made of, for example, silicon dioxide. Hence, a conductive material such as silicon is exposed at the side surfaces of the semiconductor chips 32.

(S103: Connecting Laminated Body and Board)

Figure 9:
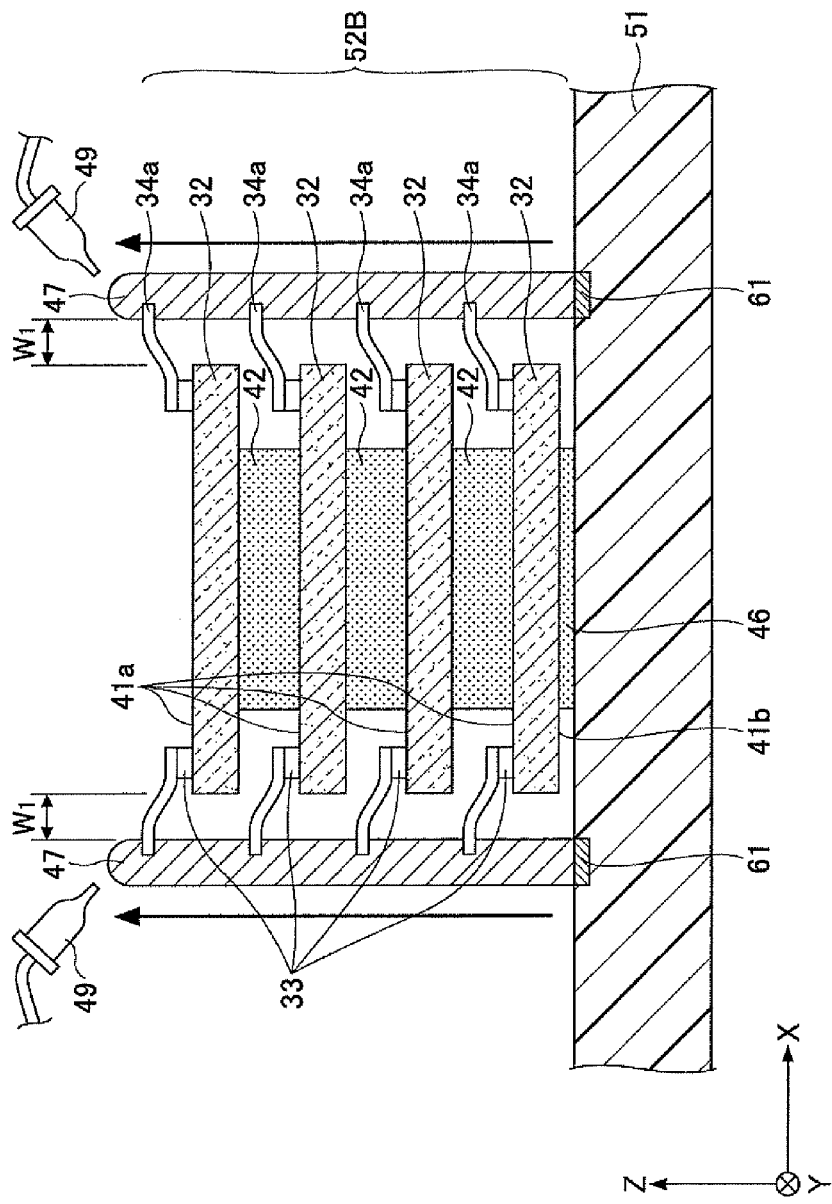
FIG. 9 is a fifth view showing an example of a manufacturing method of the semiconductor chip laminated body of the first embodiment of the present invention.

FIG. 9 illustrates end parts of the bonding wires 34a of the semiconductor chips 32 conductively connected to the connecting terminals 61 on the wiring board 51 by the conductive members 47 so that, as a whole, a chip laminated body 52B is formed. The end parts of the bonding wires 34a projecting from side surfaces of plural semiconductor chips 32 laminated in the step shown in FIG. 8 are conductively connected to connection terminals 61 of the wiring board 51 by the conductive members 47. The solder or the silver paste having high viscosity and thixotropy can be used as the conductive members 47.

Conductive connection between the end part of each of the bonding wires 34a projecting from the side surfaces of the semiconductor chips 32 and the connecting terminals 61 of the wiring board 51 by the conductive members 47 is made as follows. In other words, first, syringes 49 configured to supply the material of the conductive members 47 are prepared and are moved in the vicinity of the connecting terminals 61 of the wiring board 51. Then, while the material of the conductive members 47 is supplied from the syringes 49 to the connecting terminals 61, the syringes 49 are moved in directions indicated by arrows in FIG. 9.

At this time, the side surfaces of the semiconductor chips 32 are neither protected nor insulated by an insulation film made of, for example, silicon dioxide, so that a conductive material such as silicon is exposed at the side surfaces of the semiconductor chips 32. Therefore, the conductive members 47 may come in contact with the side surfaces of the semiconductor chips 32. Accordingly, gaps $W_1$ should be provided between the conductive members 47 and the side surfaces of the semiconductor chips 32. It is preferable to set the gap $W_1$ equal to or greater than approximately 50 μm in order to prevent the contact of the conductive members 47 and the side surfaces of the semiconductor chips 32.

A material having high viscosity and thixotropy is used as for conductive member 47, so that the end parts of the bonding wires 34a projecting from side surfaces of plural semiconductor chips 32 can be conductively connected to connection terminals 61 of the wiring board 51 by the conductive members 41 where the conductive members 47 do not come in contact with the semiconductor chips 32 (namely, where the gaps $W_1$ are formed). It is preferable that the viscosity of the material of the conductive member 47 be equal to or greater than 10000 CP and the thixotropy of the material of the conductive member 47 be equal to or greater than 4.0. By setting the viscosity and thixotropy of the material of the conductive member 47 in the above respective ranges, it is possible to prevent generation of liquid dripping when the conductive member 47 is formed in the vertical direction (Z direction).

(S104: Resin Sealing)

After the chip laminated body 52B and the wiring board 51 are connected to each other, the entirety or a part of the chip laminated body 52B, the conductive connecting members 47 connected to the connection terminals 61, and the wiring board 51 are covered by the sealing resin 48, and the semiconductor chip laminated body 20A shown in FIG. 2 is completed.

A transfer molding method, a potting method, or the like is used as a method for resin sealing. In the example shown in FIG. 2, the integrated circuit surface of the semiconductor chip 32 situated at the top is exposed through an opening in the sealing resin 49 for the purpose of, for example, heat radiation from the semiconductor chip 32. However, depending on the conditions of use of the semiconductor product, it is possible to seal the entire integrated circuit surface 41a of the semiconductor chip 32 situated at the top. Various ways of sealing can be applied.

In addition, even if an internal stress caused by a difference of thermal expansion between the semiconductor chips and the wiring board may be generated at a portion where the pads are provided, it is possible to absorb the difference of thermal expansion due to elasticity of the bonding wires. Because of this, in order to prevent free movement of the bonding wires from being obstructed by the sealing resin, sealing can be performed by limiting the sealing position.
(Effect of the First Embodiment)

When the bonding wires connected to the semiconductor chips are conductively connected to the connecting terminals of the wiring board by the conductive members, designated gaps between the conductive members and the side surfaces of the semiconductor chips are provided. As a result of this, the step of forming the insulation film on the side surfaces of each of the semiconductor chips is not required, and thereby it is possible to simplify a forming step of the semiconductor chip laminated body so that productivity can be improved.

Furthermore, it is not necessary to individually provide the bonding wires connected to the semiconductor chips leading toward the connecting terminals on the wiring board. Therefore, the length of the bonding wires connected to the semiconductor chip can be shortened. Accordingly, compared to the related art laminating type semiconductor device, it is possible to drastically reduce inductance (L) of a package of the semiconductor chip laminated body of the embodiment of the present invention.

In addition, since the semiconductor chips are laminated so that the integrated circuit surface of each of the semiconductor chips faces upward (in a Z+ side direction), it is possible make the gap between the wiring board and the semiconductor chip situated at the bottom of the chip laminated body narrow. Accordingly, the entire chip laminated body can be made even more thin, so that it is possible to provide a compact semiconductor chip laminated body.

Second Embodiment

Figure 10:
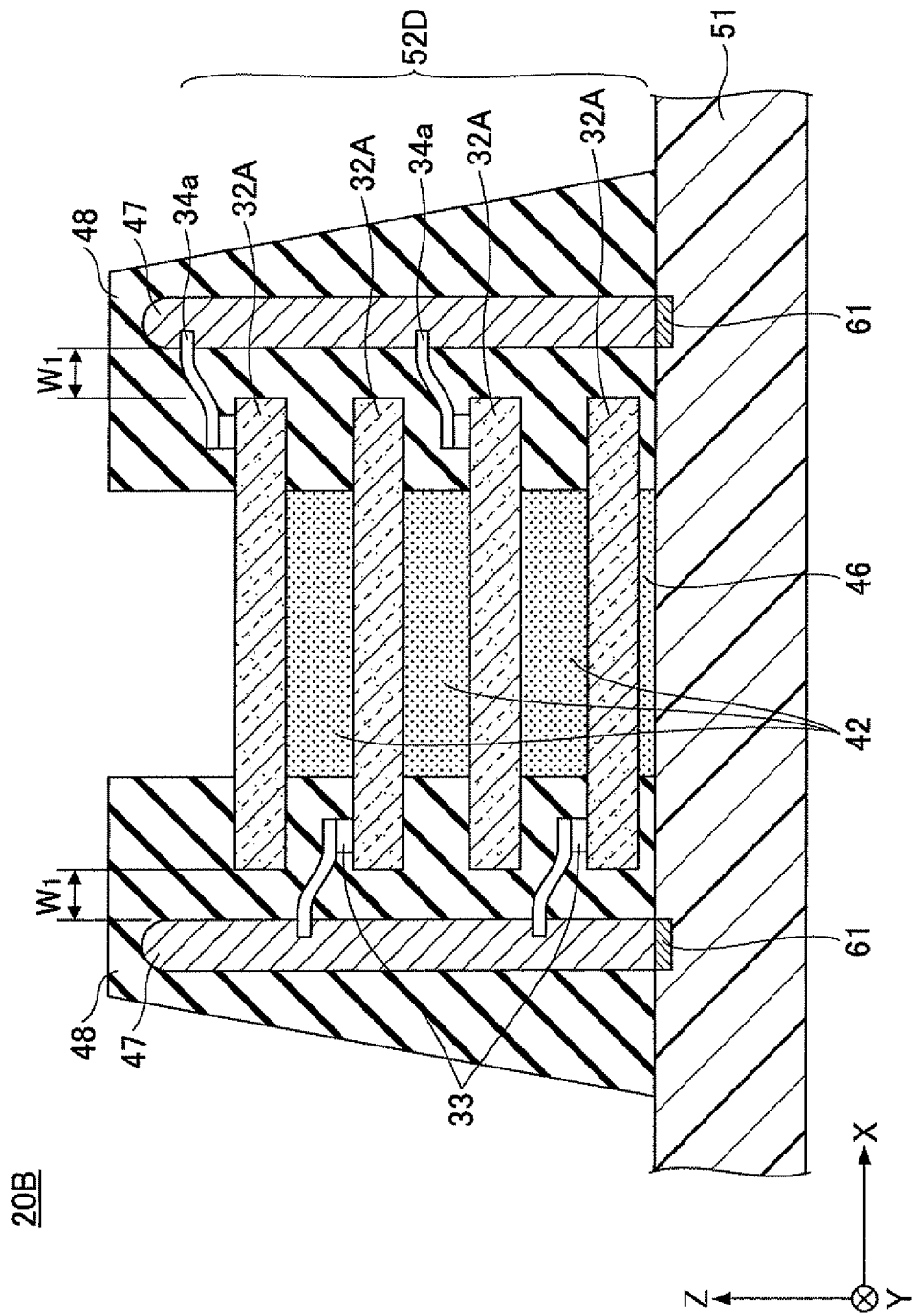
FIG. 10 is a cross-sectional view showing an example of a semiconductor chip laminated body of a second embodiment of the present invention.

FIG. 10 is a cross-sectional view showing an example of a semiconductor chip laminated body of a second embodiment of the present invention. In FIG. 10, parts that are the same as the parts shown in FIG. 2 are given the same reference numerals, and explanation thereof may be omitted.

As shown in FIG. 10, a semiconductor chip laminated body 20B has the same structure as that of the semiconductor laminated body 20A except that the semiconductor chips 32 to be mounted are replaced with semiconductor chips 32A in the semiconductor chip laminated body 20B. In the following description, explanation of parts of the semiconductor chip laminated body 20B that are the same as the parts of the semiconductor chip laminated body 20A are omitted, and parts of the semiconductor chip laminated body 20B different from the parts of the semiconductor laminated body 20A are mainly discussed.

In a chip laminated body 52D, the bonding wires 34*a* are not provided in a bilaterally symmetrical manner but project in optional directions. The projecting directions of the bonding wires 34*a* may be optional. In the example shown in FIG. 10, while one end of a bonding wire 34*a* of a certain semiconductor chip 32A projects in an X+ direction, one end of a bonding wire 34*a* of a neighboring semiconductor chip 32A projects in an X− direction.

Thus, in the chip laminated body, the bonding wires may be provided not in a bilaterally symmetrical manner but project in optional directions.

The semiconductor chip laminated body 20B can be manufactured by the method discussed with reference to FIG. 2 and explanation of the manufacturing method of the semiconductor chip laminated body 20B is omitted.
(Effect of the Second Embodiment)

The second embodiment achieves the same effect as the effect achieved by the first embodiment. In addition, according to the second embodiment, it is possible to increase the kinds of the semiconductor chips to be provided in the semiconductor chip laminated body.

Third Embodiment

Figure 11:
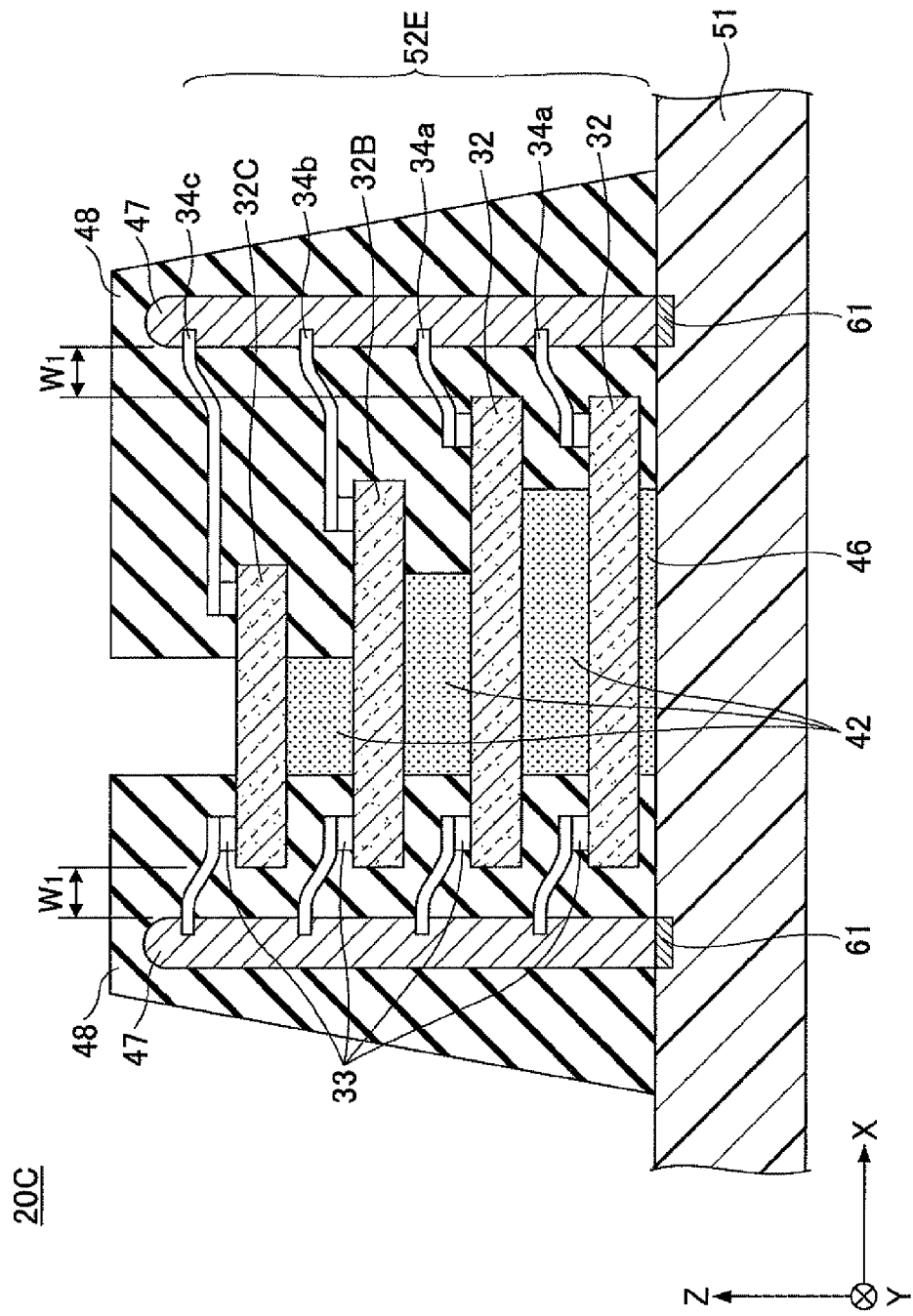
FIG. 11 is a cross-sectional view showing an example of a semiconductor chip laminated body of a third embodiment of the present invention.

FIG. 11 is a cross-sectional view showing an example of a semiconductor chip laminated body of a third embodiment of the present invention. In FIG. 11, parts that are the same as the parts shown in FIG. 2 are given the same reference numerals, and explanation thereof may be omitted.

As shown in FIG. 11, a semiconductor chip laminated body 20C has the same structure as that of the semiconductor laminated body 20A except that the semiconductor chips 32 to be mounted are replaced with semiconductor chips 32, 32, 323, and 32C in the chip laminated body 52E. In the following description, explanation of parts of the semiconductor chip laminated body 20C that are the same as the parts of the semiconductor chip laminated body 20A are omitted, and parts of the semiconductor chip laminated body 200 different from the parts of the semiconductor laminated body 20A are mainly discussed.

Chip sizes of the semiconductor chips 32, the semiconductor chip 32B, and the semiconductor chip 32C are different from each other. In addition, bonding wires 34*b* and 34*c* connected to the pads 33 of the semiconductor chips 32B and 32C are longer than the bonding wires 34*a* connected to the pads 33 of the semiconductor chips 32. This is because it is necessary to make conductive connection of one end of the bonding wires 34*a*, 34*b*, and 34*c* to the conductive member 47.

Thus, in the semiconductor chip laminated body, the semiconductor chips having different chip sizes may be laminated. In addition, if necessary, the lengths of the bonding wires may be different.

The semiconductor chip laminated body 200 can be manufactured by the method discussed with reference to FIG. 2 and explanation of the manufacturing method of the semiconductor chip laminated body 20C is omitted.
(Effect of the Third Embodiment)

The third embodiment achieves the same effect as the effect achieved by the first embodiment. In addition, according to the third embodiment, it is possible to laminate the semiconductor chips having different chip sizes by adjusting the lengths of the bonding wires in the semiconductor chip laminated body.

Fourth Embodiment

Figure 12:
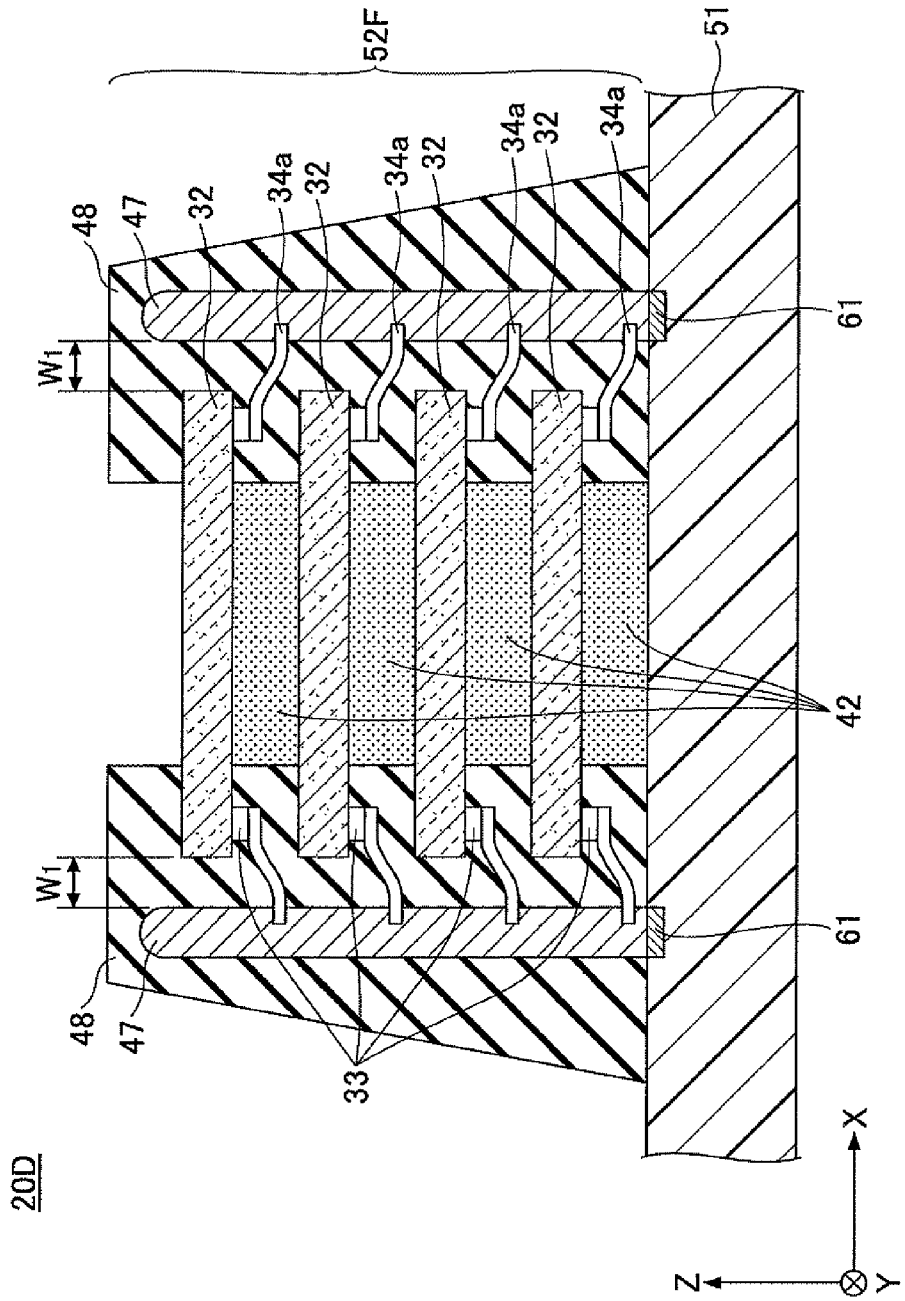
FIG. 12 is a cross-sectional view showing an example of a semiconductor chip laminated body of a fourth embodiment of the present invention.

FIG. 12 is a cross-sectional view showing an example of a semiconductor chip laminated body of a fourth embodiment of the present invention. In FIG. 12, parts that are the same as the parts shown in FIG. 2 are given the same reference numerals, and explanation thereof may be omitted.

As shown in FIG. 12, a semiconductor chip laminated body 20D has the same structure as that of the semiconductor laminated body 20A except that the semiconductor chips 32 in the chip laminated body 52F of the semiconductor chip laminated body 20D are limited to where the integrated circuit surfaces of the semiconductor chips 32 face toward the wiring board 51 side (Z− side).

Thus, in the semiconductor chip laminated body, the semiconductor chips may be laminated so that integrated circuit surfaces of the semiconductor chips face toward the wiring board side (Z− side).

The semiconductor chip laminated body 20D can be manufactured by the method discussed with reference to FIG. 2 and explanation of the manufacturing method of the semiconductor chip laminated body 20D is omitted.
(Effect of the Fourth Embodiment)

The fourth embodiment achieves the same effect as the effect achieved by the first embodiment. In addition, according to the fourth embodiment, since the insulation resin can be applied to the integrated circuit surface side of each of the semiconductor chips in the same steps as steps shown in FIG. 4 or FIG. 6, it is possible to simplify a forming step of a semiconductor chip laminated body and to improve a quality of the product.

Fifth Embodiment

Figure 13:
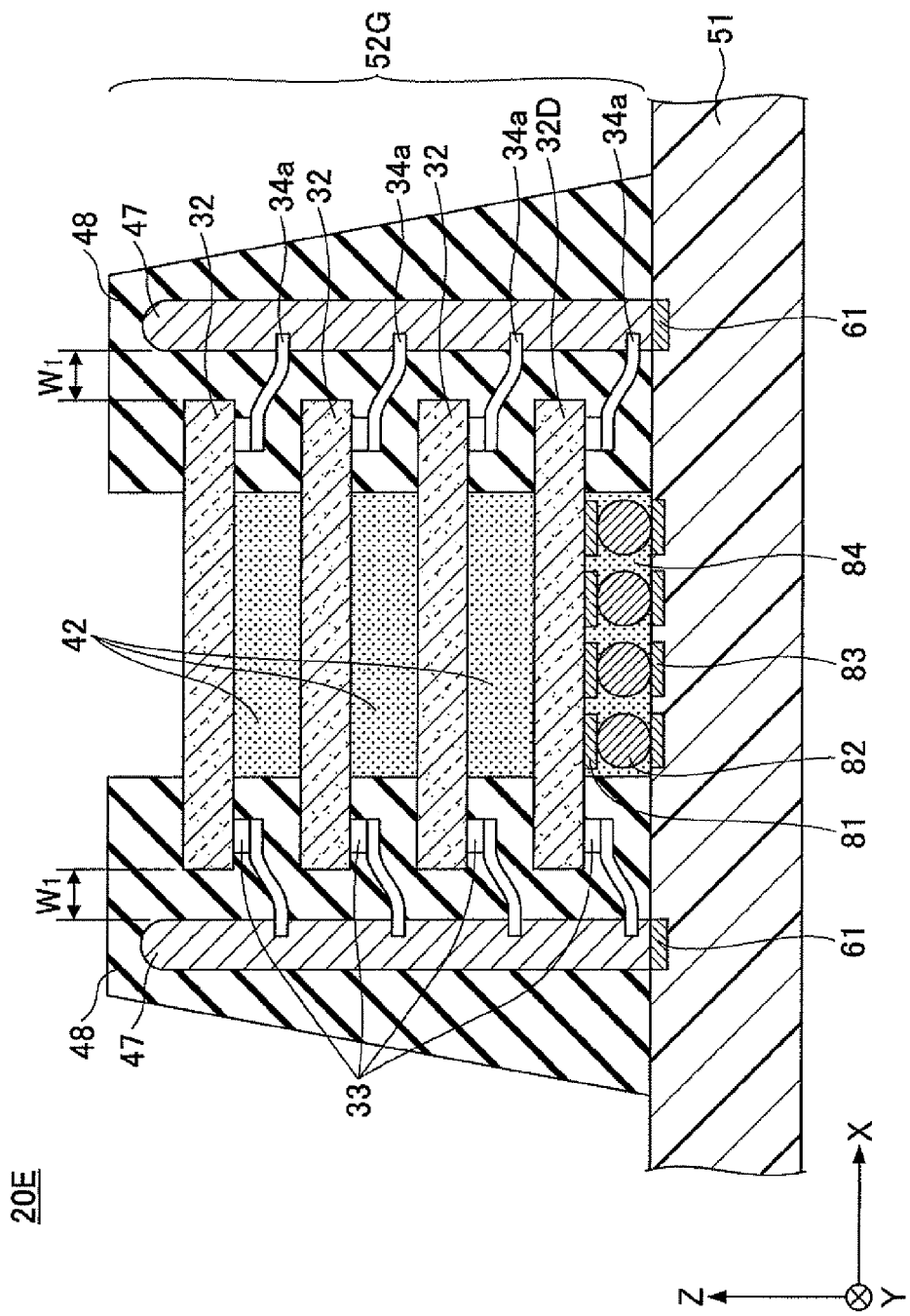
FIG. 13 is a cross-sectional view showing an example of a semiconductor chip laminated body of a fifth embodiment of the present invention.

FIG. 13 is a cross-sectional view showing an example of a semiconductor chip laminated body of a fifth embodiment of the present invention. In FIG. 13, parts that are the same as the parts shown in FIG. 2 are given the same reference numerals, and explanation thereof may be omitted.

As shown in FIG. 13, a semiconductor chip laminated body 20E has the same structure as that of the semiconductor laminated body 20A except that a semiconductor chip 32D situated at the bottom in a chip laminated body 52G is flip chip connected to the wiring board 51. In the following description, explanation of parts of the semiconductor chip laminated body 20E that are the same as the parts of the semiconductor chip laminated body 20A are omitted, and parts of the semiconductor chip laminated body 20E different from the parts of the semiconductor laminated body 20A are mainly discussed.

In FIG. 13, bumps 82 are formed on pads 81 of the integrated circuit surface of the semiconductor chip 32D at the bottom. End surfaces of the bumps 82 are exposed at a surface of an insulation film 84 applied on the integrated circuit surface.

The bump 82 may be formed by a ball bonding method using a bonding wire, a ball bump method where a ball formed separately is mounted and fixed, or other methods. By flip chip connection, the bumps 82 of the semiconductor chip 32D and connecting terminals 83 on the wiring board 51 are connected to each other. The flip chip connection can be made on the connecting terminals 83 by applying a solder whose composition is silver or the like.

Thus, in the semiconductor chip laminated body, the semiconductor chip at the bottom may be flip chip connected to the wiring board.

The semiconductor chip laminated body 20E can be manufactured by the method discussed with reference to FIG. 2 and explanation of the manufacturing method of the semiconductor chip laminated body 20E is omitted.

(Effect of the Fifth Embodiment)

The fifth embodiment achieves the same effect as the effect achieved by the first embodiment. In addition, according to the fifth embodiment, it is possible to form a semiconductor chip laminated body where a logic chip and a memory chip known as KGD (Known Good Die) are combined. Therefore, in the design of the semiconductor package, it is possible to expand the area of the semiconductor chip using the way of the semiconductor chip laminated body. In addition, it is possible to make the size of the semiconductor chip laminated body compact and to further improve capabilities.

According to the above-discussed embodiments, it is possible to simplify manufacturing steps and to improve the quality of the product.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A semiconductor chip laminated body, comprising:
   a wiring board having a connecting terminal;
   a plurality of semiconductor chips laminated on the wiring board, each of the semiconductor chips having a pad;
   conductive connecting members having first end parts connected to the pads of the corresponding semiconductor chips and second end parts projecting from side surfaces of the corresponding semiconductor chips;
   a conductive member that is made of a conductive paste in block, formed in a vertical direction, and configured to connect the connecting terminal of the wiring board and the second end parts of the conductive connecting members by embedding the second end parts in the conductive member to conductively connect the conductive connecting members to each other; and
   a sealing resin configured to seal the semiconductor chips, the conductive connecting members, and the conductive member,
   wherein conductive materials are exposed at the side surfaces of the semiconductor chips, and
   a gap is provided between the side surfaces of the semiconductor chips and the conductive member, and sealed with the sealing resin.

2. The semiconductor chip laminated body as claimed in claim 1,
   wherein a viscosity of a material of the conductive member is equal to or greater than 10000 CP and a thixotropy of the material of the conductive member is equal to or greater than 4.0.

3. The semiconductor chip laminated body as claimed in claim 1,
   wherein diameters of the conductive connecting members are 15 μm through 30 μm, and the gap is equal to or greater than approximately 50 μm.

4. The semiconductor chip laminated body as claimed in claim 1,
   wherein the second end parts of the conductive connecting members at the laminated and neighboring semiconductor chips are projected in different directions.

5. The semiconductor chip laminated body as claimed in claim 1,
   wherein one of the semiconductor chips among the plural semiconductor chips laminated on the wiring board has a size different from the other of the semiconductor chips.

6. The semiconductor chip laminated body as claimed in claim 1,
   wherein
   a semiconductor chip facing the wiring board among the plural semiconductor chips laminated on the wiring board is flip chip connected to the wiring board.

7. The semiconductor chip laminated body as claimed in claim 1,
   wherein the sealing resin is provided between the plurality of semiconductor chips and between the wiring board and the semiconductor chip.

* * * * *